United States Patent
Webb

(10) Patent No.: US 6,542,371 B1
(45) Date of Patent: Apr. 1, 2003

(54) HIGH THERMAL CONDUCTIVITY HEAT TRANSFER PAD

(75) Inventor: Brent J. Webb, Pasco, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/704,963

(22) Filed: Nov. 2, 2000

(51) Int. Cl.[7] .................................. H05K 7/20
(52) U.S. Cl. ................ 361/708; 361/704; 361/705; 361/706; 361/707; 361/709; 257/717; 174/16.3; 165/80.2; 165/80.3; 165/185; 428/408; 428/378; 442/117
(58) Field of Search .................. 361/704, 705, 361/706, 707, 708, 709, 710, 717–719; 257/706, 717–719; 174/16.3; 165/80.2, 80.3, 104.33, 185; 428/408, 378; 442/117

(56) References Cited

U.S. PATENT DOCUMENTS

| | | | | |
|---|---|---|---|---|
| 4,299,715 A | * | 11/1981 | Whitfield et al. | 165/185 |
| 4,590,122 A | * | 5/1986 | Levin | 442/210 |
| 5,316,080 A | * | 5/1994 | Banks et al. | 165/185 |
| H1699 H | * | 12/1997 | Vavrick | 156/276 |
| 5,695,847 A | * | 12/1997 | Browne | 428/112 |
| 5,705,106 A | * | 1/1998 | Kolesnikov et al. | 264/29.1 |
| 5,783,862 A | * | 7/1998 | Deeney | 257/714 |
| 5,804,875 A | * | 9/1998 | Remsburg et al. | 257/718 |
| 5,818,693 A | * | 10/1998 | Garner et al. | 361/700 |
| 5,825,624 A | * | 10/1998 | Arnold et al. | 361/708 |
| 5,870,286 A | * | 2/1999 | Butterbaugh et al. | 361/704 |
| 5,949,650 A | * | 9/1999 | Bulante et al. | 361/704 |
| 5,962,348 A | * | 10/1999 | Bootle et al. | 442/265 |
| 6,060,166 A | * | 5/2000 | Hoover et al. | 428/408 |
| 6,077,597 A | * | 6/2000 | Pause | 428/218 |
| 6,096,414 A | * | 8/2000 | Young | 428/220 |
| 6,311,769 B1 | * | 11/2001 | Bonneville et al. | 165/185 |

FOREIGN PATENT DOCUMENTS

EP    0-049 791 A2  *  4/1982  ........... H01L/23/36

* cited by examiner

*Primary Examiner*—Boris Chervinsky
(74) *Attorney, Agent, or Firm*—Schwegman, Lundberg, Woessner & Kluth, P.A.

(57) ABSTRACT

A thermal pad for use in facilitating heat flow between a heat source surface and a heat sink surface includes a carbon fiber fabric that is impregnated with a thermal substance.

33 Claims, 2 Drawing Sheets

HIGH THERMAL CONDUCTIVITY HEAT TRANSFER PAD

FIELD OF THE INVENTION

The invention relates generally to thermal management techniques for use within an electrical apparatus and, more particularly, to interstitial structures for improving heat flow between an electrical component and a heat sink.

BACKGROUND OF THE INVENTION

Many electrical components generate relatively large amounts of heat during periods of operation. This heat is most often the result of resistive losses within the components that are generally unavoidable. If this heat is not removed from the electrical component in an efficient manner, it will build up and dangerous temperatures may result. Electrical components operating at very high temperatures will often malfunction and can be permanently damaged. Therefore, thermal management techniques are often implemented within electrical circuits and systems to facilitate heat removal during periods of operation.

Thermal management techniques often involve the use of some form of heat sink to conduct heat away from high temperature areas in an electrical system. A heat sink is a structure formed from a high thermal conductivity material (e.g., typically a metal) that is mechanically coupled to an electrical component to aid in heat removal. In a relatively simple form, a heat sink can include a large piece of metal (e.g., aluminum or copper) that is clamped to an electrical circuit during operation. Heat from the electrical circuit flows into the heat sink through the mechanical interface between the units. Once in the heat sink, the heat is able to spread out and may also be radiated into the surrounding air space by the heat sink. If the mass and thermal conductivity of the heat sink is adequate, this may be all that is required to maintain an acceptable temperature level within the electrical component. In other cases, additional air or liquid cooling of the heat sink may be required. Many heat sinks include a series of fins or heat spreader plates for increasing the rate at which heat is transferred into the surrounding environment.

As described above, a heat sink is mechanically coupled to the heat producing component during operation. Typically, a flat surface of the heat sink will be held against a flat surface of the electrical component using some form of clamp or fastener. As can be appreciated, the surface of the heat sink and the surface of the component will rarely be perfectly planar or smooth, so air gaps will generally exist between the surfaces. As is generally well known, the existence of air gaps between two opposing surfaces reduces the ability to transfer heat through the interface between the surfaces. Thus, these air gaps reduce the effectiveness and value of the heat sink as a thermal management device. To address this problem, various thermal interface materials and structures (e.g., thermal greases and compliant pads) have been developed for placement between the heat transfer surfaces to decrease the thermal resistance there between. A thermal grease is a paste-like substance that is spread over one or both of the heat transfer surfaces before the surfaces are mated. When the surfaces are subsequently brought together, the thermal grease fills the air gaps between the surfaces, thus improving the thermal transfer properties of the interface. Thermal greases are typically difficult to apply and many tend to "bleed" from the thermal interface region or dry out during circuit operation. In addition, some thermal greases are conductive and can cause short circuits within an electrical system if care is not taken during application. A compliant pad is a thin flat structure that is placed between the heat transfer surfaces to reduce thermal resistance. Compliant pads are more convenient to use than thermal greases, but typically fall short in thermal transfer performance.

Therefore, there is a need for a thermal interface structure having enhanced thermal transfer characteristics.

DETAILED DESCRIPTION

Figure 1:
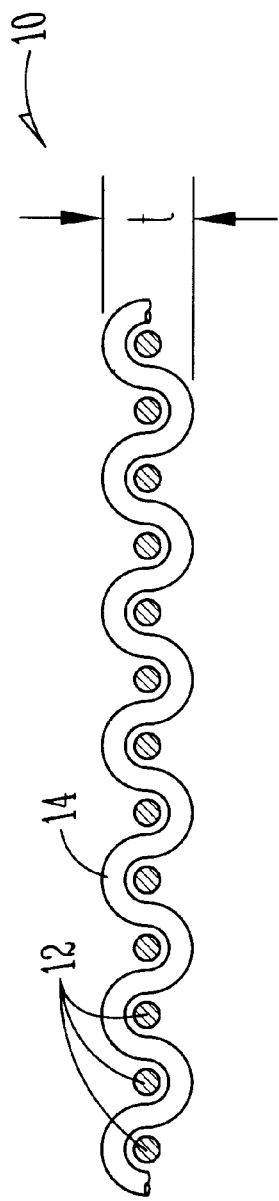
FIG. 1 is a sectional side view illustrating a carbon fiber fabric in accordance with one embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to a thermal pad structure having enhanced thermal heat transfer characteristics. The thermal pad structure utilizes a relatively high thermal conductivity carbon fiber fabric as a support structure for carrying a thermal substance, such as a phase change material or a thermal grease. The superior thermal characteristics of the carbon fiber material and continuous weave connecting both surfaces enhance the bulk conductivity of the thermal substance, thereby resulting in a relatively low thermal resistance interface between the heat transfer surfaces. In addition, the excellent structural qualities of the carbon fiber material enhance the convenience and reliability of the thermal pad. The thermal pad can be used as a thermal management tool for a wide variety of different electrical devices, circuits, and systems. For example, the pad can be used in connection with various digital devices that typically dissipate large amounts amount of energy during operation (e.g., microprocessors, chip-sets, digital signal processors (DSPs), application specific integrated circuits (ASICs), and others). In addition, the thermal pad can be used to facilitate heat flow away from various power devices such as power transistors, RF devices, chassis mount resistors, relays, and others. In fact, the thermal pad can be used to reduce thermal resistance in almost any scenario where heat is required to flow through an interface between two imperfect surfaces.

FIG. 1 is a sectional side view illustrating a carbon fiber fabric 10 in accordance with one embodiment of the present invention. The fabric 10 includes a plurality of carbon fiber threads 12, 14 (also known as tows) that are woven together in a substantially orthogonal pattern to form a relatively flat fabric sheet. The threads 12 having a lengthwise orientation are commonly referred to as "warp" threads and the threads 14 that are orthogonal to the warp threads are commonly referred to as the "fill" threads. The carbon fiber threads 12, 14 are each formed from a plurality of individual carbon fibers (also known as filaments) that are bundled together by, for example, twisting or spinning. In one known method, such carbon fibers are made by subjecting a polymer known as polyacrylonitrile to a relatively complex heating process. The carbon content of the individual fibers will typically range from 88 percent to 99.9 percent. In one embodiment, the carbon fibers consist of graphite, which is a form of pure carbon. The individual carbon fibers will typically have a diameter between 6 and 9 microns. These small diameters allow the carbon filaments to quickly oxidize should fragments contact electrical leads and cause a short. One manufacturer of raw carbon fibers is BP-Amoco Corporation. The thickness of the carbon fiber threads 12, 14 will generally depend upon the number of fibers that are bundled together to form the thread. Carbon fiber threads will typically include between 100 and 12,000 individual fibers bundled together in a longitudinal arrangement or tow. One manufacturer of carbon fiber threads is Hexcel Corporation.

The thickness t of the carbon fiber fabric 10 will depend upon, among other things, the thickness of the carbon fiber threads 12, 14 that are used to make the fabric 10. The warp count of carbon fiber fabrics typically ranges from about 4 to about 50 ends per inch and the fill count from about 4 to about 50 pics per inch. The weight of carbon fiber fabrics typically ranges from about 0.5 ounces per square yard to about 25 ounces per square yard. The carbon fiber fabric 10 can utilize any of a plurality of well known weave patterns, including a plain weave, a twill weave, and a basket weave. In one embodiment, the fabric 10 is first woven and then carbonized as a continuous fabric at an elevated temperature in an inert atmosphere. Carbon fiber fabrics, such as the one illustrated in FIG. 1, are available commercially for use in a number of different applications. Such fabrics can be purchased from, for example, Carbon Composites Company of Paia, Hi. and Morton Thiokol. Carbon fiber fabrics are most commonly used as structural lattices for epoxy resins and other thermosetting materials to form composite materials. These "composites" are typically very strong and lightweight and can be used to replace metals in many applications. Some common uses for these composites include aircraft and spacecraft parts, industrial products, and recreational equipment such as tennis rackets and golf clubs. In one embodiment of the invention, a 3.5 ounce per square yard, 1K×1K, carbon fiber fabric having a warp count of 24 ends per inch and a fill count of 24 pics per inch (e.g., Carbon Composites part number 1350–42V) is used as the carbon fiber fabric 10. The actual fabric that is used in a particular implementation of the invention will normally depend upon the specifics of the system or circuit within which the fabric to be used.

Figure 2:
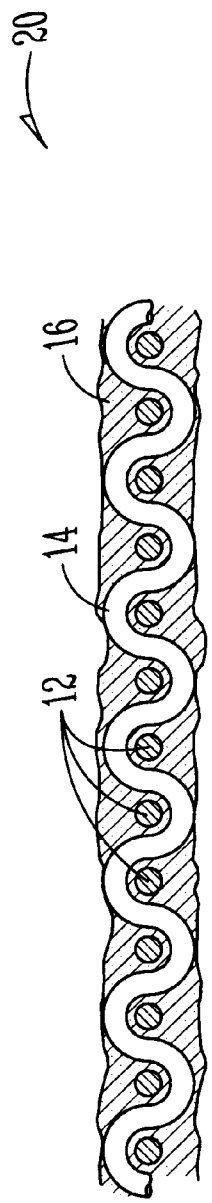
FIG. 2 is a sectional side view illustrating a thermal pad in accordance with one embodiment of the present invention.

FIG. 2 is a sectional side view illustrating the carbon fiber fabric 10 of FIG. 1 impregnated with a thermal substance 16 to form a thermal pad 20 in accordance with one embodiment of the present invention. The carbon fiber fabric 10 provides a relatively strong support structure to hold the thermal substance 16 in place, thus allowing the thermal pad 20 to be inserted and removed from an electrical system with relative ease. In addition, as described above, the relatively high thermal conductivity of the carbon fibers within the fabric 10 acts to enhance the bulk conductivity of the thermal substance 16 within the thermal interface region.

The thermal substance 16 can include any of a wide variety of materials that will perform a gap-filling function within the interstice between the heat transfer surfaces during periods of operation. In addition, the thermal substance 16 should have relatively good thermal transfer properties. In one embodiment, the thermal substance 16 includes a thermal grease material. Thermal greases typically consist of a binding agent (e.g., a silicone paste) that is augmented with one or more other substances (often metallic in nature) to increase thermal conductivity. Some commonly used thermal conductivity enhancing substances include, for example, oxides of zinc, silver, aluminum, and copper. Metallic powders have also been used. Thermal greases are available from many different manufacturers including, for example, Melcor and MicroSi Inc.

In another embodiment of the invention, the thermal substance 16 includes a phase change material. As the name implies, a phase change material is a material that changes its phase of matter when operational heat is present. This typically involves a change from a solid or semi-solid form to a liquid form. Once changed, the liquid substance can flow into gaps and crevices within the thermal interface region to reduce the amount of air within the interface during periods of operation. As can be appreciated, this "wetting action" can decrease the thermal resistance of the interface significantly. Some phase change materials that can be used in accordance with the invention include waxes and lipids. In one approach, for example, a vegetable-based lipid (e.g., vegetable shortening) is used as a thermal substance 16. Other food grade materials can also be used.

In yet another embodiment of the invention, a liquid oil (e.g., vegetable oil or silicone oil) is used as the thermal substance 16. As will be apparent to a person of ordinary skill in the art, a wide variety of other substances can also be used to impregnate the carbon fiber fabric in accordance with the present invention.

The thermal substance 16 can be applied to the carbon fiber fabric 10 using any of a number of different methods. If the thermal substance 16 is a phase change material, for example, the material can be melted within a vessel and the fabric 10 can be dipped into the molten material. The fabric 10 is then removed from the molten material and allowed to dry. If a liquid-thermal substance is used, such as an oil, the fabric 10 can be soaked in the liquid or the liquid can be sprayed, brushed, or rolled onto the fabric 10. Semi-solid thermal substances, such as vegetable shortening or certain waxes, can be tooled into the fabric mechanically, such as by troweling. In one approach, a thermal substance 16 is applied to the fabric 10 using a glide-on applicator, such as those commonly used to apply deodorants. The thermal substance that is applied in this manner can be, for example, a solid stick or a semi-solid paste material. As will be apparent to person of ordinary skill in the art, many other application methods also exist.

In one approach, the thermal pad 20 will be marketed as a finished product. That is, customers will purchase the pad material with the thermal substance already applied. The product can be sold, for example, in sheets, rolls, or as precut thermal interface pads. In another approach, the thermal pad 20 will be fabricated during a circuit assembly procedure. Typically, this will involve applying a thermal substance to the fabric, cutting a piece of carbon fiber fabric to an appropriate shape, and placing the resulting structure between the circuit component to be cooled and the corresponding heat sink.

As described above, the relatively high thermal conductivity of the carbon fibers within the support fabric weave of the thermal pad 20 enhances the bulk thermal conductivity of the associated thermal substance to generate a relatively low thermal resistance interface between the heat transfer surfaces. Carbon fibers are also beneficial in that they typically undergo relatively little thermal expansion when heated and are generally non-corrosive. As described above, in one embodiment, a woven carbon fiber fabric is used as the support structure for the thermal pad. It should be appreciated that other types of carbon fiber fabric can also be used in accordance with the present invention. For example, in one embodiment, a matted or felted fabric made from short discontinuous carbon links (e.g., shards) is used as the structural material of a thermal pad. Matted or felted carbon fiber fabrics will typically be less expensive than woven fabrics of the same weight. However, because the orientation of the fibers is more random in a matted fabric, the thermal transfer properties of the matted fabric may be inferior to those of the woven fabric. Hence, a cost benefit analysis may be needed. Knitted fabrics can also be used.

The carbon fiber fabric that is used to form the thermal pad in accordance with the present invention can also include other materials in addition to the carbon fiber. For example, various hybrid fabrics can be used. In one embodiment, a hybrid fabric of carbon fiber and Kevlar is used as the structural member of the thermal pad 20. In another embodiment, a hybrid fabric of carbon fiber and metallic thread is used. The metallic thread can be used to further enhance the thermal conductivity of the fabric. In yet another embodiment, carbon fiber threads are interlaced within a metallic lattice (formed from, for example, thin copper strands) to form the support structure of the pad. Such hybrid fabrics may also be used to provide shielding for electromagnetic interference (EMI) if the corresponding thermal pad is shaped to enclose the circuit package (e.g., an integrated circuit package). Preferably, the carbon fiber fabric will consist of 50% or more of carbon fiber by weight (although smaller ratios are also possible). As will be appreciated by a person of ordinary skill in the art, many alternative hybrid fabric combinations also exist.

Figure 3:
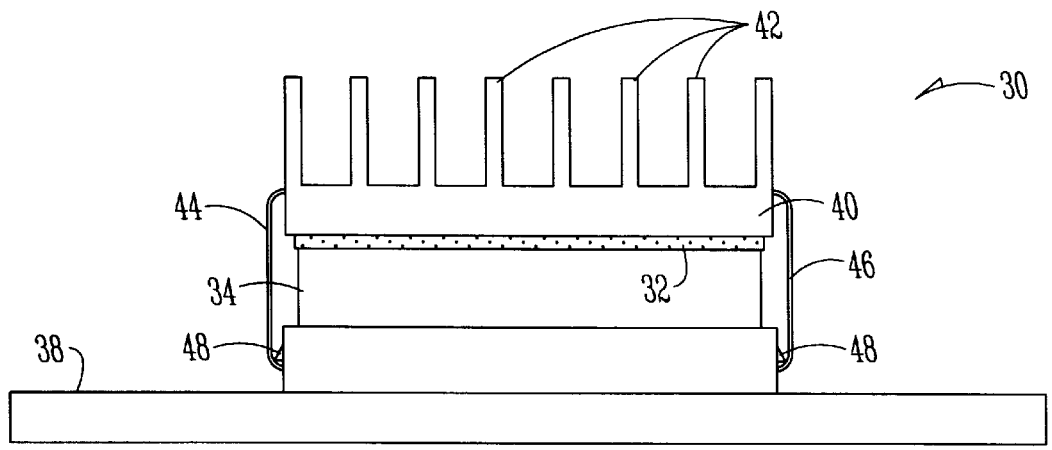
FIG. 3 is a side view illustrating a digital circuit arrangement utilizing a thermal pad in accordance with one embodiment of the present invention.

FIG. 3 is a side view illustrating a digital circuit arrangement 30 using a thermal pad 32 in accordance with one embodiment of the present invention. As illustrated, the digital circuit arrangement 30 also includes: an integrated circuit (IC) package 34 housing a microprocessor chip, a printed circuit board (PCB) 38, and a heat sink 40. The PCB 38 includes a number of integral signals lines for carrying signals to and from the IC package 34. The IC package 34 is coupled to the PCB 38 to provide signal communication between the signal lines of the PCB 38 and the microprocessor chip. When operating, the microprocessor chip generates heat due to power dissipation within its circuitry. As discussed previously, some of this heat must be removed to maintain an acceptable operating temperature for the chip. The heat sink 40 is used to facilitate heat removal from the IC package 34. The thermal pad 32 is located between the IC package 34 and the heat sink 40 to reduce the thermal resistance of the interface, thus increasing heat flow away from the package 34. The heat that flows into the heat sink 40 is radiated into the surrounding environment by a plurality of fins 42 on the heat sink 40.

To enhance the effectiveness of the thermal pad 32, pressure is applied to partially compress the pad 32 between the heat transfer surfaces. In the illustrated embodiment, for example, a pair of clips 44, 46 are provided for holding the heat sink 40 down against the thermal pad 32. The clips 44, 46 are integral with the heat sink 40 and snap in place over ridges 48 on the IC package 34 when the heat sink 40 is pressed downward over the thermal pad 32. As will be apparent to a person of ordinary skill in the art, any number of alternative fastening or clamping methods can also be used to compress the thermal pad 32. By compressing the thermal pad 32 between the IC package 34 and the heat sink 40, the thermal substance within the pad 32 is forced into gaps and crevices within the interface region, thus eliminating much of the air from the region. In addition, when a phase change material is used as the thermal substance, the wetting action of the material will further fill gaps and crevices within the interface region during operational periods. The carbon fibers within the structural fabric of the thermal pad 32 will contact the heat transfer surfaces at a multitude of locations to further enhance thermal transfer. Typically, the thickness of the thermal pad 32 will be selected based on the maximum gap dimension that is anticipated between the heat transfer surfaces. Preferably, a thermal pad will be used that has the smallest available thickness that is capable of filling the maximum anticipated gap size. Because of the structural integrity of the carbon fiber fabric, there will typically be little or no "bleeding" from the thermal interface region during operation.

Figure 4:
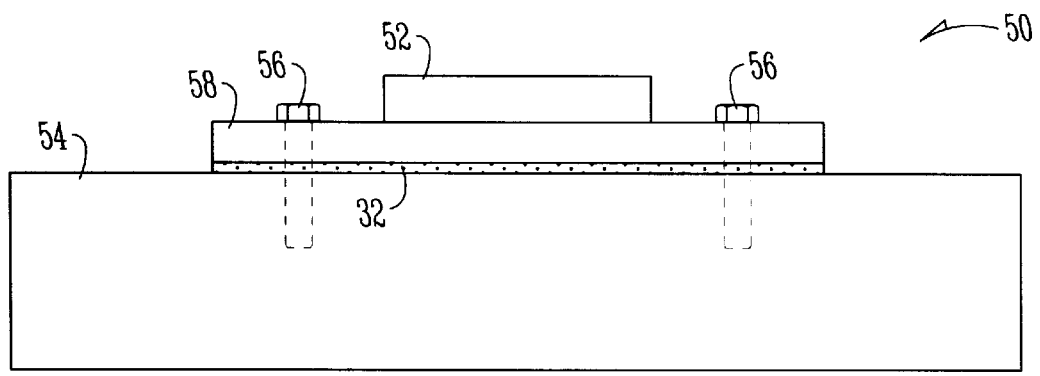
FIG. 4 is a side view illustrating a power circuit utilizing a thermal pad in accordance with one embodiment of the present invention.

FIG. 4 is a side view illustrating a portion of a power circuit 50 utilizing a thermal pad 32 in accordance with one embodiment of the present invention. As illustrated, the thermal pad 32 is disposed between the flange 58 of a power transistor 52 and a metallic ground plane 54 that also serves as a heat sink. The flange 58 is fastened to the ground plane 54 using screws 56, thus partially compressing the thermal pad 32 between the heat transfer surfaces. During power circuit operation, the power transistor 52 heats up and the resultant heat flows through the thermal pad 32 into the ground plane 54 where it is able to spread out. Additional liquid or convection cooling of the ground plane 54 can also be provided.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A heat transfer structure for placement between two opposing surfaces to facilitate heat transfer between the surfaces, comprising:
   a fabric having a high carbon fiber content, wherein said fabric includes at least 50 percent carbon fiber by weight; and
   a thermally conductive thermal substance impregnating said fabric.

2. The heat transfer structure claimed in claim 1, wherein:
   said fabric includes a plurality of carbon fiber threads, each of said carbon fiber threads comprising a number of individual carbon fibers bundled together in a substantially longitudinal arrangement.

3. The heat transfer structure claimed in claim 1, wherein said fabric is a woven fabric.

4. The heat transfer structure claimed in claim 1, wherein said fabric is a felted continuous fiber fabric.

5. The heat transfer structure claimed in claim 1, wherein said fabric includes a plurality of metallic threads.

6. The heat transfer structure claimed in claim 1, wherein said fabric includes graphite fibers.

7. The heat transfer structure claimed in claim 1, wherein said thermal substance includes a phase change material.

8. The heat transfer structure claimed in claim 7, wherein:
said thermal substance includes a wax having a melting point within an operational temperature range of said heat transfer structure.

9. The heat transfer structure claimed in claim 1, wherein said thermal substance includes a thermal grease.

10. The heat transfer structure claimed in claim 1, wherein said thermal substance includes a lipid.

11. The heat transfer structure claimed in claim 1, wherein said thermal substance includes a vegetable derived lipid.

12. The heat transfer structure claimed in claim 1, wherein said thermal substance includes an oil.

13. The heat transfer structure claimed in claim 1, wherein said heat transfer structure consists of a precut heat transfer pad.

14. An electrical apparatus comprising:
an electrical component that generates heat when in an operative condition;
a heat sink that is capable of absorbing heat applied to a surface thereof; and
a heat transfer pad disposed between said electrical component and said heat sink to facilitate heat flow therebetween, said heat transfer pad including:
a fabric having a high carbon fiber content, wherein said fabric includes at least 50 percent carbon fiber by weight; and
a thermally conductive thermal substance impregnating said fabric.

15. The electrical apparatus claimed in claim 14, wherein said electrical component includes an integrated circuit.

16. The electrical apparatus claimed in claim 14, wherein said electrical component includes a digital processing device.

17. The electrical apparatus claimed in claim 14, wherein said electrical component includes a power transistor.

18. The electrical apparatus claimed in claim 14, wherein said heat sink includes a metallic ground structure.

19. A method for use in assembling an electrical apparatus, comprising:
providing an electrical component;
providing a heat sink;
providing a heat transfer pad having a fabric with a high carbon fiber content that is impregnated with a thermally conductive thermal substance, wherein said fabric, without the thermally conductive thermal substance, includes at least 50 percent carbon fiber by weight;
placing said heat transfer pad between said electrical component and said heat sink; and
applying pressure to partially compress said heat transfer pad between said electrical component and said heat sink.

20. The method claimed in claim 19, wherein:
said fabric includes a fabric that is woven from carbon fiber threads.

21. The method claimed in claim 19, wherein:
providing a heat transfer pad includes applying said thermal substance to said fabric.

22. The method claimed in claim 19, wherein:
providing a heat transfer pad includes cutting said heat transfer pad from a sheet of heat transfer material.

23. The method claimed in claim 19, wherein said heat sink includes a metallic ground structure.

24. The electrical apparatus of claim 14, comprising:
means for applying pressure between said electrical component and said heat sink to partially compress said heat transfer pad therebetween.

25. The electrical apparatus of claim 24, wherein:
said means for applying pressure includes a clamp.

26. The electrical apparatus of claim 24, wherein:
said means for applying pressure holds said heat transfer pad between said electrical component and said heat sink during operation of said apparatus, wherein said heat transfer pad is easily removable from between said electrical component and said heat sink when said means for applying pressure is removed.

27. The electrical apparatus of claim 14, wherein:
carbon fibers within said fabric contact heat transfer surfaces of said electrical component and said heat sink at a multitude of locations.

28. A heat transfer pad comprising:
a fabric including carbon fiber threads interlaced within a metallic lattice; and
a thermally conductive substance impregnating said fabric.

29. The heat transfer pad of claim 28, wherein:
said thermally conductive substance includes an oil.

30. The heat transfer pad of claim 28, wherein:
said thermally conductive substance includes a lipid.

31. A heat transfer pad comprising:
a fabric having a high carbon fiber content, wherein said fabric includes at least 50 percent carbon fiber by weight; and
a thermally conductive liquid oil impregnating said fabric.

32. The heat transfer pad of claim 31, wherein:
said thermally conductive liquid oil includes a vegetable oil.

33. The heat transfer pad of claim 31, wherein:
said thermally conductive liquid oil includes a silicone oil.

\* \* \* \* \*